(12) United States Patent
Chet et al.

(10) Patent No.: US 7,038,305 B1
(45) Date of Patent: May 2, 2006

(54) PACKAGE FOR INTEGRATED CIRCUIT DIE

(75) Inventors: Tan Ping Chet, Gelugor (MY); Allen Cheah Chong Leng, Bayan Lepas (MY)

(73) Assignee: Altera Corp., San Jose, CA (US)

( * ) Notice: Subject to any disclaimer, the term of this patent is extended or adjusted under 35 U.S.C. 154(b) by 44 days.

(21) Appl. No.: 10/621,255

(22) Filed: Jul. 15, 2003

(51) Int. Cl.
| H01L 23/495 | (2006.01) |
| H01L 23/34 | (2006.01) |
| H01L 23/48 | (2006.01) |
| H01L 23/52 | (2006.01) |
| H01L 21/44 | (2006.01) |

(52) U.S. Cl. .................. 257/675; 257/666; 257/691; 257/692; 257/698; 257/784; 257/712; 257/713; 438/123; 438/617

(58) Field of Classification Search ............ 257/712, 257/675, 676, 684, 713, 714, 706, 666, 691, 257/692, 698, 784; 438/123, 617
See application file for complete search history.

(56) References Cited

U.S. PATENT DOCUMENTS

| 4,680,613 A | 7/1987 | Daniels et al. |
| 4,791,473 A | 12/1988 | Phy |
| 4,842,662 A * | 6/1989 | Jacobi .................. 156/633 |
| 4,916,506 A | 4/1990 | Gagnon |
| 4,933,741 A | 6/1990 | Schroeder |
| 4,965,654 A | 10/1990 | Karner et al. |
| 5,060,052 A | 10/1991 | Casto et al. |
| 5,067,005 A | 11/1991 | Michii et al. |
| 5,068,708 A | 11/1991 | Newman |
| 5,173,767 A | 12/1992 | Lange et al. |
| 5,457,340 A | 10/1995 | Templeton, Jr. et al. |
| 5,491,362 A * | 2/1996 | Hamzehdoost et al. ...... 257/712 |
| 5,585,672 A * | 12/1996 | Koike et al. ................. 257/707 |
| 5,596,231 A | 1/1997 | Combs |
| 5,744,383 A | 4/1998 | Fritz |
| 5,757,070 A | 5/1998 | Fritz |
| 5,912,804 A * | 6/1999 | Lawson et al. ............ 361/704 |
| 6,225,685 B1 * | 5/2001 | Newman et al. ............ 257/666 |
| 6,285,075 B1 * | 9/2001 | Combs et al. .............. 257/675 |
| 6,452,278 B1 | 9/2002 | DiCaprio et al. |
| 6,777,818 B1 * | 8/2004 | Baldwin ...................... 257/795 |
| 2004/0032022 A1 * | 2/2004 | Ding .......................... 257/706 |

FOREIGN PATENT DOCUMENTS

| GB | 2 168 533 A | 6/1986 |
| JP | 63-293869 | 11/1988 |
| JP | 1-143246 | 6/1989 |
| JP | 4-130653 | 5/1992 |

* cited by examiner

Primary Examiner—Nitin Parekh

(57) ABSTRACT

An integrated circuit device package and method of assembling same is disclosed. The device package includes an interposer ring substrate having a hollowed out center mounted on a die attach pad, a die mounted substantially in the center of the die attach pad such that the die is encompassed by the hollowed out center. The package further includes a single-piece drop-in heat sink having a first and second disk shaped portions where the first disk shaped portion has a diameter that is different than the second disk shaped portion.

23 Claims, 8 Drawing Sheets

PACKAGE FOR INTEGRATED CIRCUIT DIE

BACKGROUND OF THE INVENTION

This invention is related to integrated circuit packages and more particularly to integrated circuit packages that include ground and/or power planes.

During operation, integrated circuit devices generate heat which is conducted to the outside of the semiconductor device through the leads and the package body. However, the heat generated by the integrated circuit device is not efficiently dissipated to the outside of the integrated circuit device because the resin which forms the package body is made of materials, e.g. an epoxy resin, which have poor thermal conductivity characteristics. The heat therefore remains in the semiconductor device, thereby increasing the likelihood of device malfunction due to elevated temperature. Elevated temperatures result in a deterioration of the electrical characteristics, e.g. an increase in noise and a reduction in the response speed of the semiconductor device.

Additionally, the presence of resistance, capacitance and inductance in the electrical conductors within an integrated circuit package gives rise to noise in the electrical signals transmitted to and from the integrated circuit. Power planes and ground planes have been used in integrated circuit packages in an attempt to provide uniform ground and power supplies to an integrated circuit and to reduce electrical noise.

By varying the geometries and materials of the integrated circuit package components, the thermal and electrical characteristics of the integrated circuit package can be changed. This invention is directed to an integrated circuit device package having improved heat dissipating properties and electrical characteristics.

BRIEF SUMMARY OF THE INVENTION

The integrated circuit of the present invention includes a die mounted substantially in the center of a first surface of a die attach pad and an interposer ring substrate mounted on the same first surface of the die attach pad. A heat sink is adjacent the second surface of the die attach pad.

Preferably, the interposer ring substrate is a rectangular substrate with a hollowed out center that is large enough to accommodate the die mounted in the center of the die attach pad. The interposer ring substrate further includes one or more conductive bands that run along the edges of the substrate.

Preferably, the heat sink is a single-piece drop-in heat sink. Preferably, the heat sink comprises two disk shaped portions having different diameters.

DETAILED DESCRIPTION OF THE PREFERRED EMBODIMENTS

The present invention is directed to an integrated circuit device package having improved heat dissipating properties and electrical characteristics. The integrated circuit of the present invention includes a die mounted substantially in the center of a first surface of a die attach pad and an interposer ring substrate having a hollow center mounted on the same first surface of the die attach pad. A heat sink is adjacent the second surface of the die attach pad.

Having an interposer ring substrate with a hollow center allows the interposer ring to be mounted directly onto the die attach pad. Mounting the die directly onto the die attach pad allows for faster heat dissipation than mounting the die on the interposer ring substrate and then mounting the assembly onto the die attach pad. Additionally, having the interposer ring avoids wire sweeping problems because extremely long wires can be disjointed by first bonding the wire from the die to the conduction band layer and then forming another bond from the conduction layer to the outside of the chip.

Figure 1:
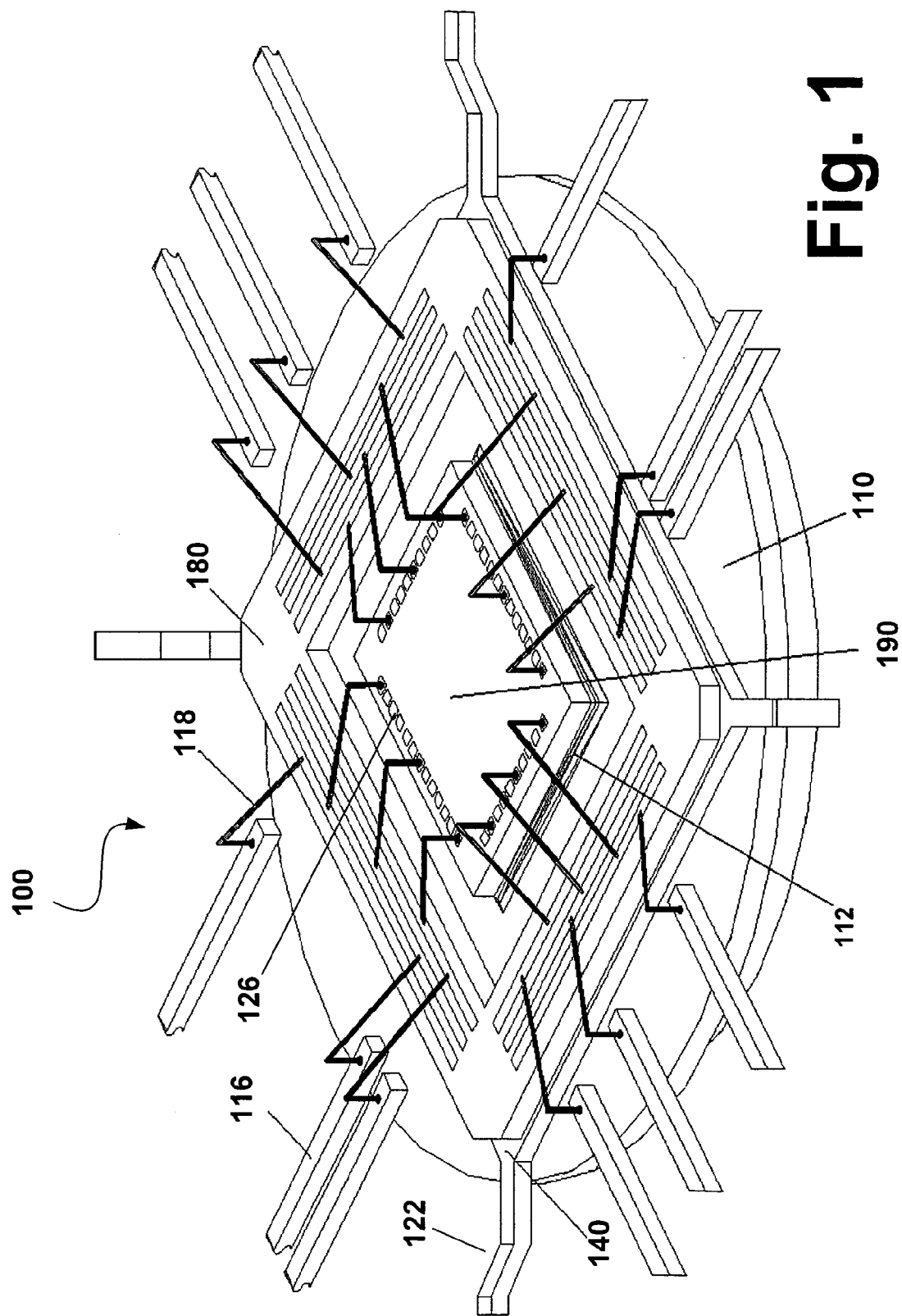
FIG. 1 illustrates an integrated circuit die package in accordance with certain aspects of the present invention.

FIG. 1 illustrates an integrated circuit die package in accordance with certain aspects of the present invention. Integrated circuit die package 100 includes a die 190 and an interposer ring substrate 180, both mounted on one side of a die attach pad 140. Tie bars 122 extend away from each of the four corners of die attach pad 140 and are used for handling the integrated circuit during processing. A heat sink mass 110 is mounted on the opposite side of the die attach pad 140. Package 100 further includes a plurality of lead fingers 116 that are selectively connected to the die 190 and ring 180 via wire bonds 118.

The die 190, die attach pad 140, interposer ring substrate 180 and heat sink mass 110 are encapsulated in, for instance, plastic molding compound, so that the ends of the leads are exposed outside the plastic molding compound. The exposed ends of the leads are used to make electrical connections to electronic components outside the packaged integrated circuit. Plastic molding compound packages may be formed by such manner as through manual or automatic transfer molding.

Die 190 is any integrated circuit including an application specific integrated circuit (ASIC), a field programmable gate array (FPGA), complex programmable logic device (CPLD), or the like. Die 190 comprises electronic circuitry formed centrally on the die and a plurality of bond pads 126 formed around the periphery of the die. Die 190 is mounted on the die attach pad 140 in any manner that holds the die 190 on the die attach pad 140.

Die attach pad 140 is made of any conductive material such as a copper or silver alloy. Die attach pad 140 may serve as ground plane or a power plane by connecting the die attach pad to a ground or power source respectively. In the preferred embodiment, die attach pad 140 does not perform any electrical function.

Heat sink mass 110 transmits heat from the die 190 and is made of a heat conductive metal with the ability to transmit heat rapidly. Heat sink mass 110 is discussed in greater detail in connection with FIGS. 5 and 6.

Figure 2:
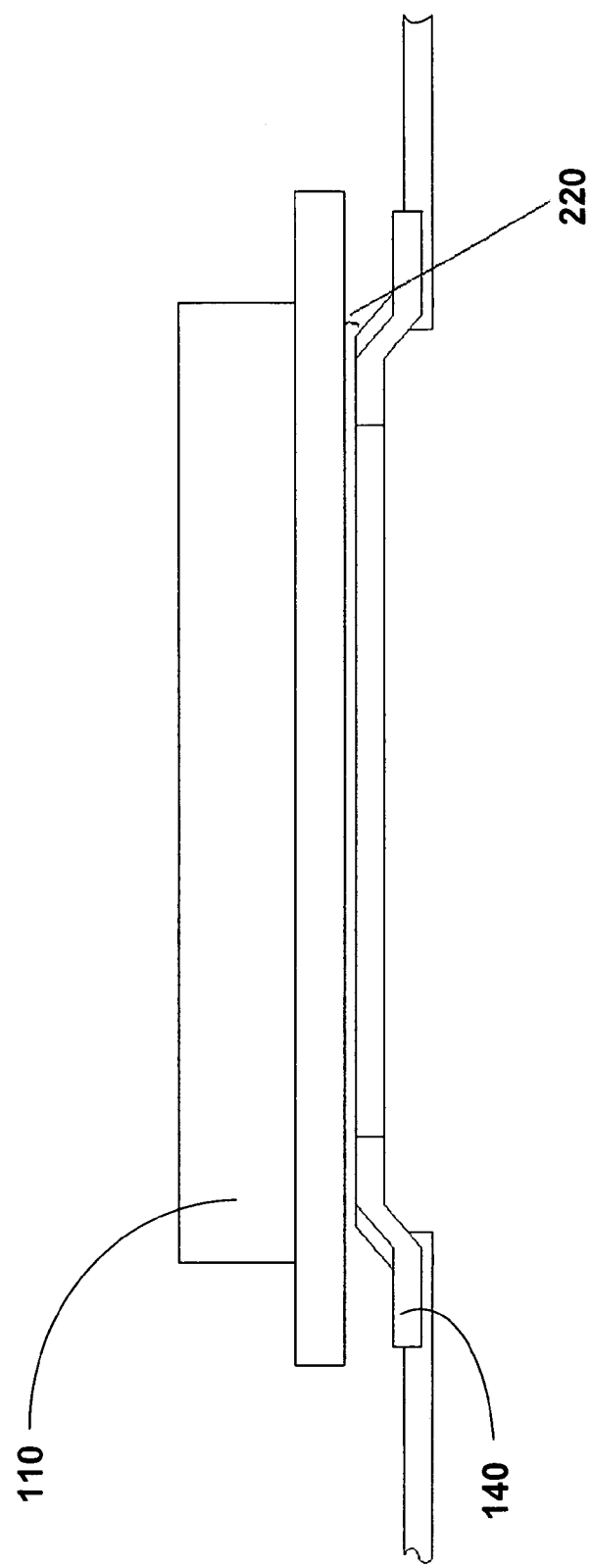
FIG. 2 is a front side view of the integrated circuit package of FIG. 1.

FIG. 2 is a cross-sectional view of the integrated circuit package of FIG. 1. Preferably, heat sink mass 110 is separated from the die attach pad 140 by a separation gap 220. In one embodiment, the separation gap 220 is about 100 micrometers. In other embodiments, the heat sink mass is attached to the die attach pad using an epoxy or adhesive tape where the epoxy or adhesive tape is electrically non-conductive but thermally conductive.

Die 190 is attached to die attach pad 140 using an adhesive 112. Adhesive 112 is any epoxy, thermoplastic or polyimide resin or double-sided tape adhesive as are commonly available from vendors such as Able-stick, Ablebond, or Sumitomo. Adhesive 112 may be either electrically insulating or electrically conductive depending on the voltage bias of the substrate of the die 190 and the electrical function of the die attach pad. Preferably, adhesive 112 is electrically insulating and thermally conductive for rapid dissipation of heat from the die 190.

Interposer ring substrate 180 is also attached to the die attach pad using an adhesive 112 or another adhesive having similar electrical and thermal properties. Preferably, tie bars 122 are bent so that die 190 and interposer ring substrate 180 do not protrude above the tie bar or the lead fingers 116. Although the preferred embodiment shows a single die package, those skilled in the art will appreciate that the package may incorporate multiple dies.

Figure 3:
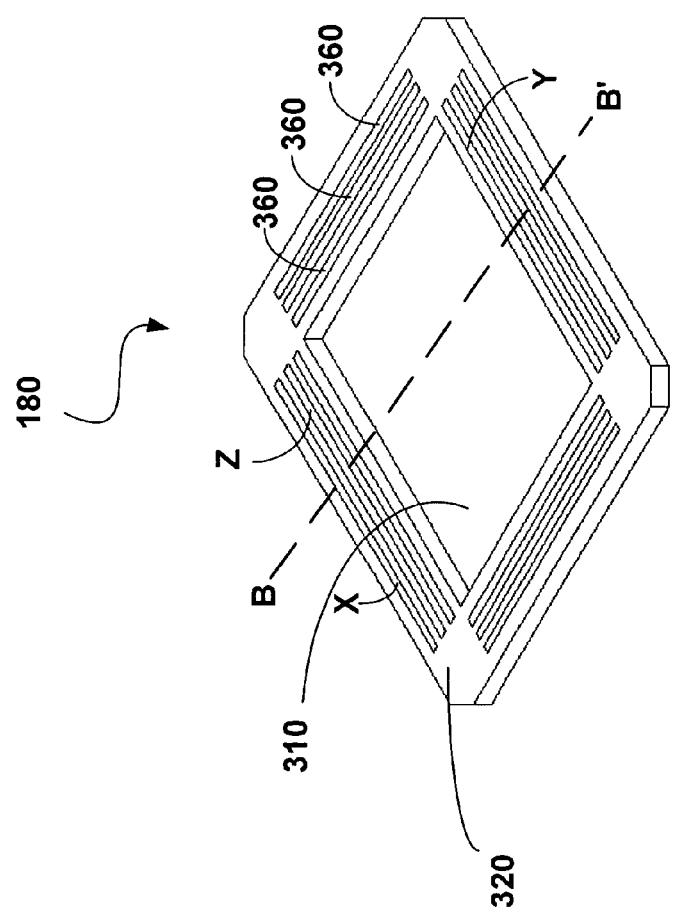
FIG. 3 is an illustration of an interposer ring substrate in accordance with the invention.

FIG. 3 is an illustration of an interposer ring substrate in accordance with the invention. Substrate 180 is substantially rectangular with a hollowed center portion 310. Having an interposer ring with a hollowed out center allows the die to be mounted directly onto the die attach pad and thereby provide for better and faster heat dissipation than if the die were mounted on the interposer ring substrate which is then mounted onto the die attach pad. The hollowed center portion is sufficiently large to accommodate the die 190.

The gap between the substrate 180 and the die 190 is large enough to minimize electrical interaction between the die, substrate and die attach pad. Surface 320 of the substrate 180 includes three conduction bands 360 on each of the four sides of the substrate. The conduction bands 360 may be used for power or ground connections. Alternately, conduction bands 360 may be held at any voltage potential by connecting the bands to a voltage source outside the packaged integrated circuit.

Although, the preferred embodiment shows three conduction bands, those skilled in the art will appreciate that any number of bands may be used. Additionally, the bands on each side may be connected to respective bands on the adjacent sides, thereby forming a continuous ring around the die. Further, each of the bands on a given side may be held at a different voltage than corresponding bands on other sides of the substrate. Thus, band x may be held at a different voltage than band y, band z may be at a different voltage than band x and so on. Although, the preferred embodiment uses a substantially rectangular substrate with a substantially rectangular hollowed portion, any suitably shaped substrate may be used, i.e. a disk substrate with a circular hollowed portion and curved conduction bands running parallel to the outer edge of the substrate.

Figure 4:
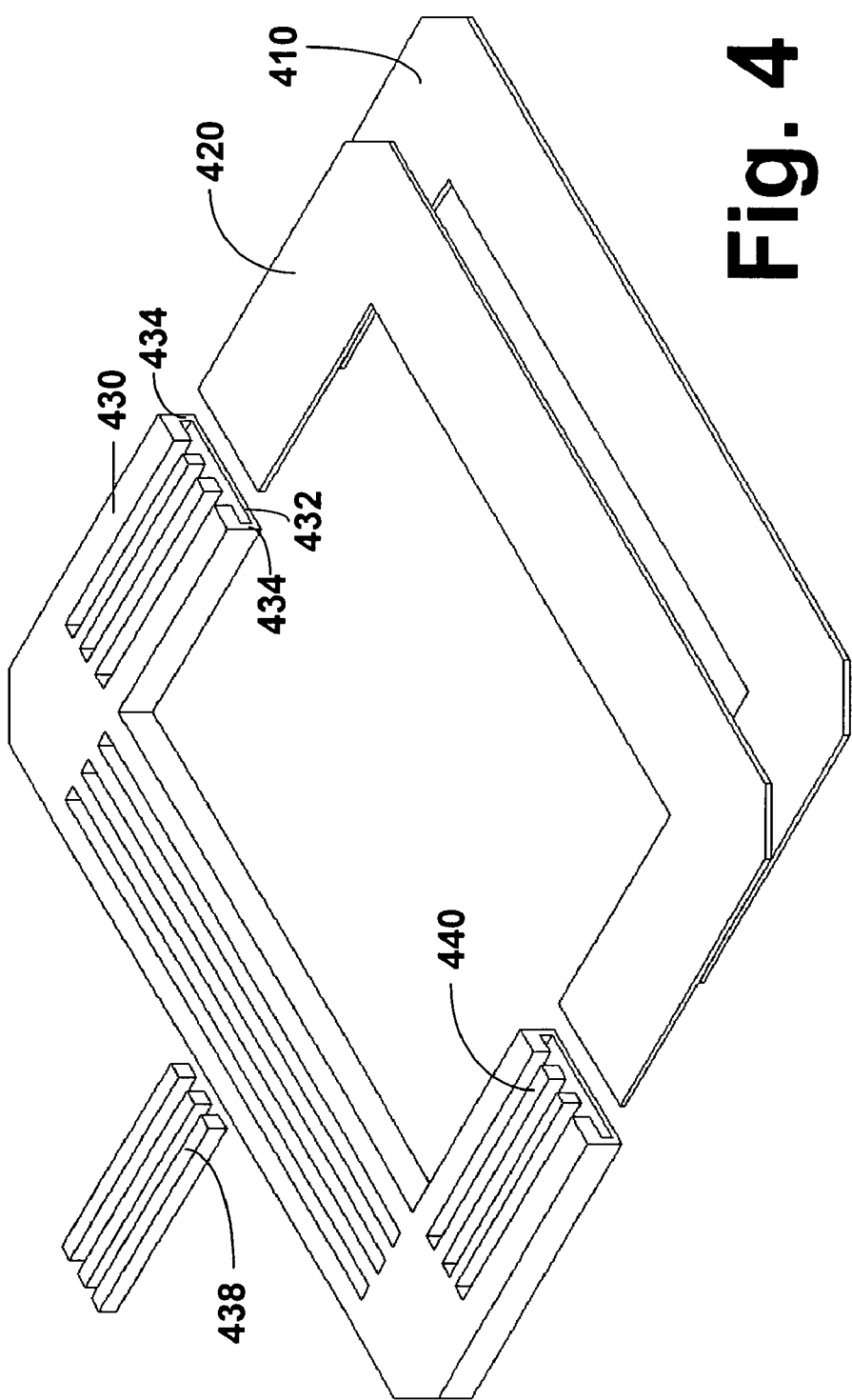
FIG. 4 is a cross sectional view of the interposer ring substrate along the B—B' (FIG. 3) line through the substrate.

FIG. 4 is a cross sectional view of the interposer ring substrate along the B—B' (FIG. 3) line through the substrate 180. Preferably, interposer ring substrate 180 comprises a dummy plane layer 410 and a dielectric layer 420 over dummy layer 410. The dummy layer 410 and dielectric layer 420 are encapsulated in solder mask material structure 430. Structure 430 comprises a layer 432 that is adjacent one flat surface of the dummy plane layer 410 with the opposite flat surface of the dummy plane layer being adjacent the dielectric layer. Structure 430 further comprises side layers 434 that cover the side surfaces of layers 410 and 420 and a layer 436 that is adjacent one flat surface of dielectric layer 420 with the opposite flat surface of the dielectric layer being adjacent the dummy plane layer 410. Layer 436 includes a plurality of conduction bands 438 which are separated by solder mask material bands 440.

Dummy layer 410 is a hollowed out copper plate that provides structural rigidity for interposer ring substrate 180. Any material that provides adequate structural support may be used to form the dummy layer. Dielectric layer 430 separates the conduction band layers 438 from dummy layer 410 and has a lower dielectric constant than the dummy layer or the conduction band layers. The dielectric layer can be made of dielectric materials such as BT (Bismaleimid Triazine) or FR4 (woven glass/epoxy resin composition) based organic resins. Conduction bands 438 are copper strip bands that conduct power or ground potential to and from die 190 via wire bonds 118. Conduction bands 438 can be of any suitable conductive material. In some embodiments, the conduction bands may be plated with silver or gold to promote better bonding adhesion.

Solder mask structure 430 protects and masks dummy layer 410 from oxidation. Structure 430 also electrically separates conduction bands 438 from each other. Additionally, structure 430 masks selective areas of interposer ring substrate 180 from accepting any wire bonds 118. Preferably, the solder mask structure 430 comprises a three layered photosensitive material.

Figure 5:
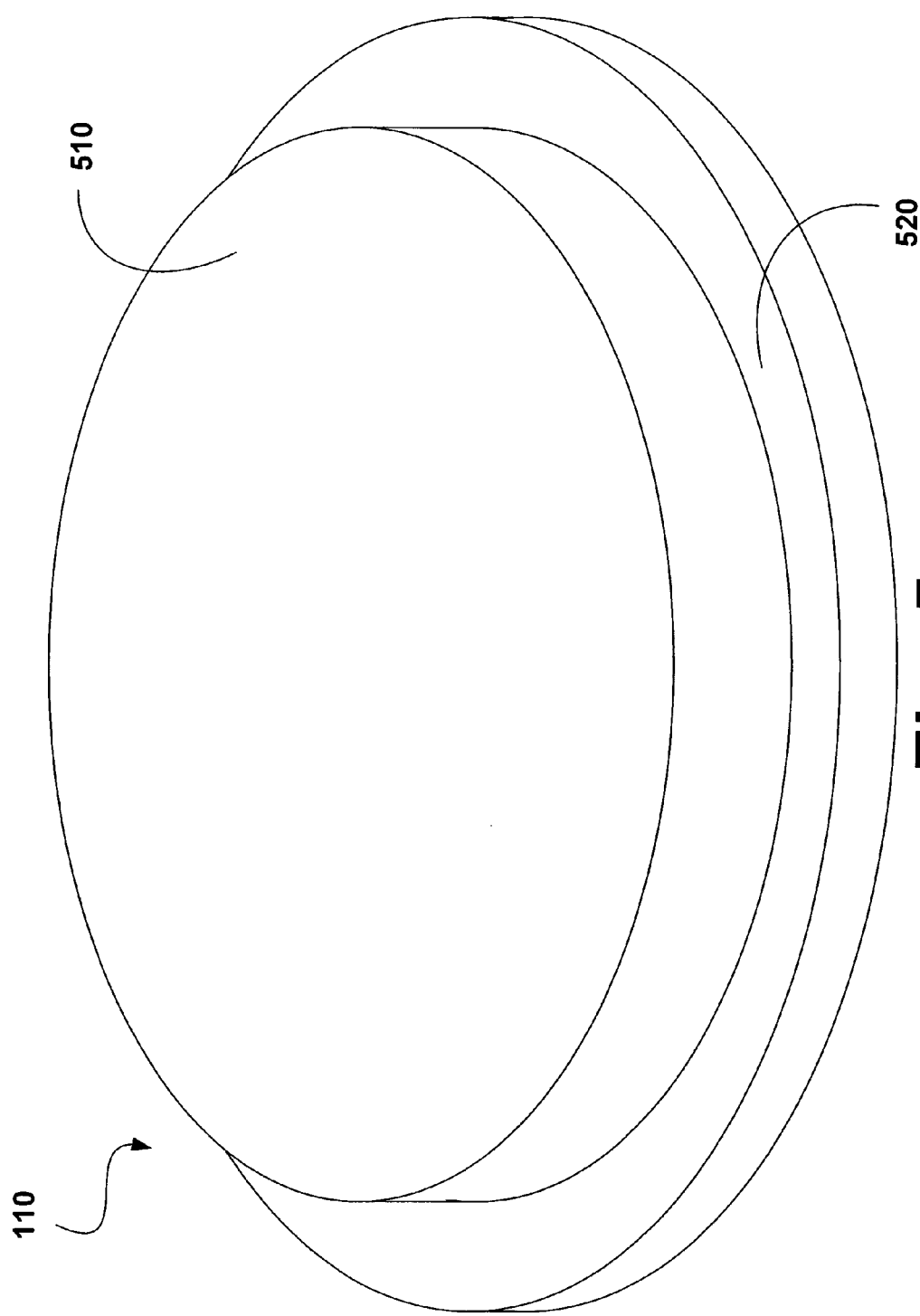
FIG. 5 is an illustration of a top view of a heat sink mass that may be used in accordance with certain aspects of the present invention.

FIG. 5 is an illustration of a top view of a heat sink mass that may be used in accordance with certain aspects of the present invention. Heat sink mass 110 is a single piece drop-in heat sink and is made of any material capable of rapid heat transfer. Preferably, heat sink 110 is made of copper that is aluminum or nickel plated. Heat sink 110 comprises two portions: a first portion 520 being a disk of a first diameter and a second portion 510 adjacent the first portion 520 being a disk having a second diameter where the first diameter is greater than the second diameter.

Figure 6:
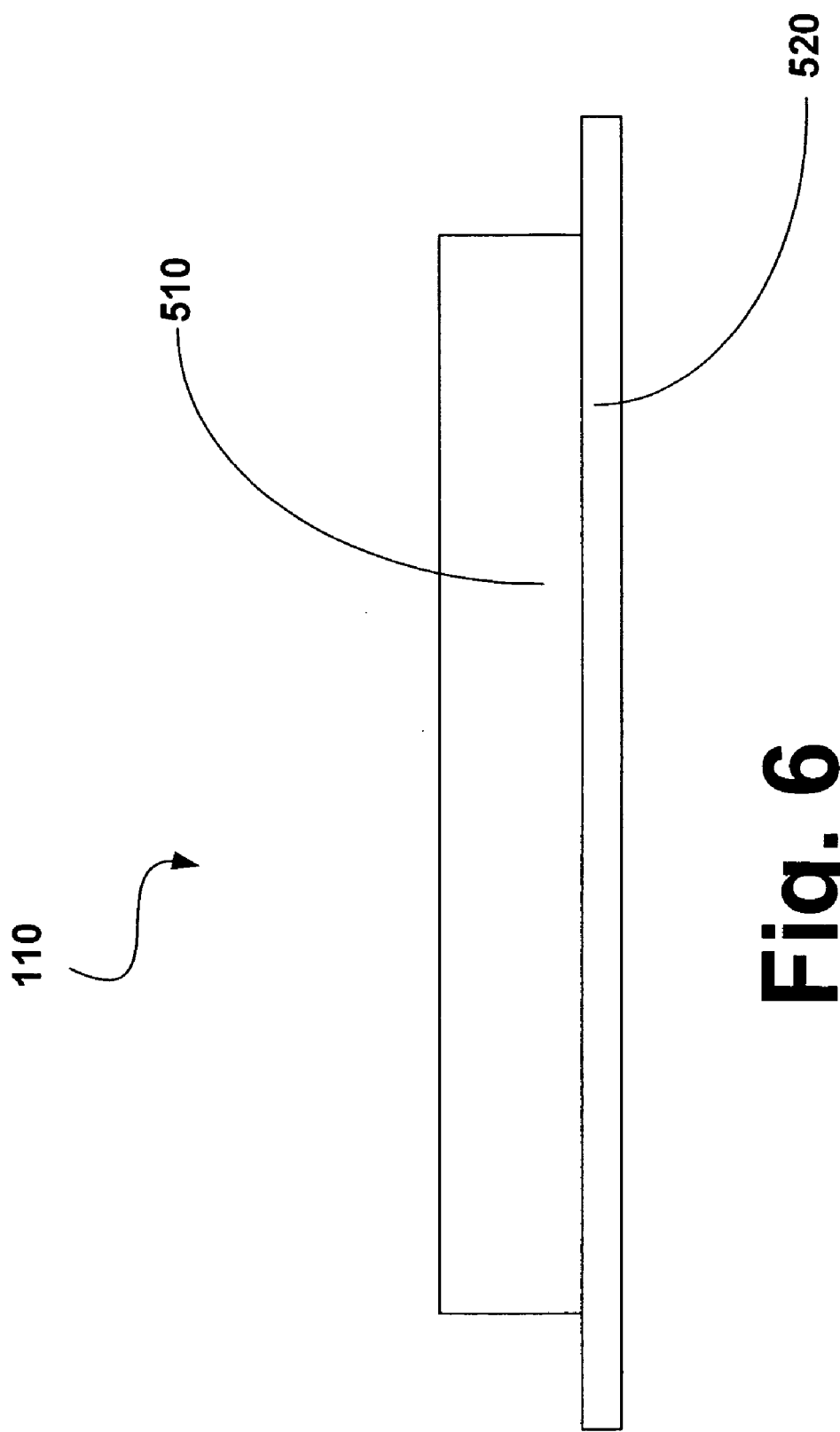
FIG. 6 is a side view of heat sink mass in accordance with the invention.

Other heat sinks may comprise any number of disks of varying diameters. By having disks of varying diameters, the surface area of the heat sink is increased and thus heat is dissipated more rapidly than where a single disk is used. FIG. 6 is a side view of heat sink mass 110 in accordance with the invention. Although, the heat sink mass in the preferred embodiment comprises disks of varying diameters, heat sink mass 110 could be any shape that promotes rapid heat transfer, e.g. rectangular shaped instead of circular.

Figure 7:
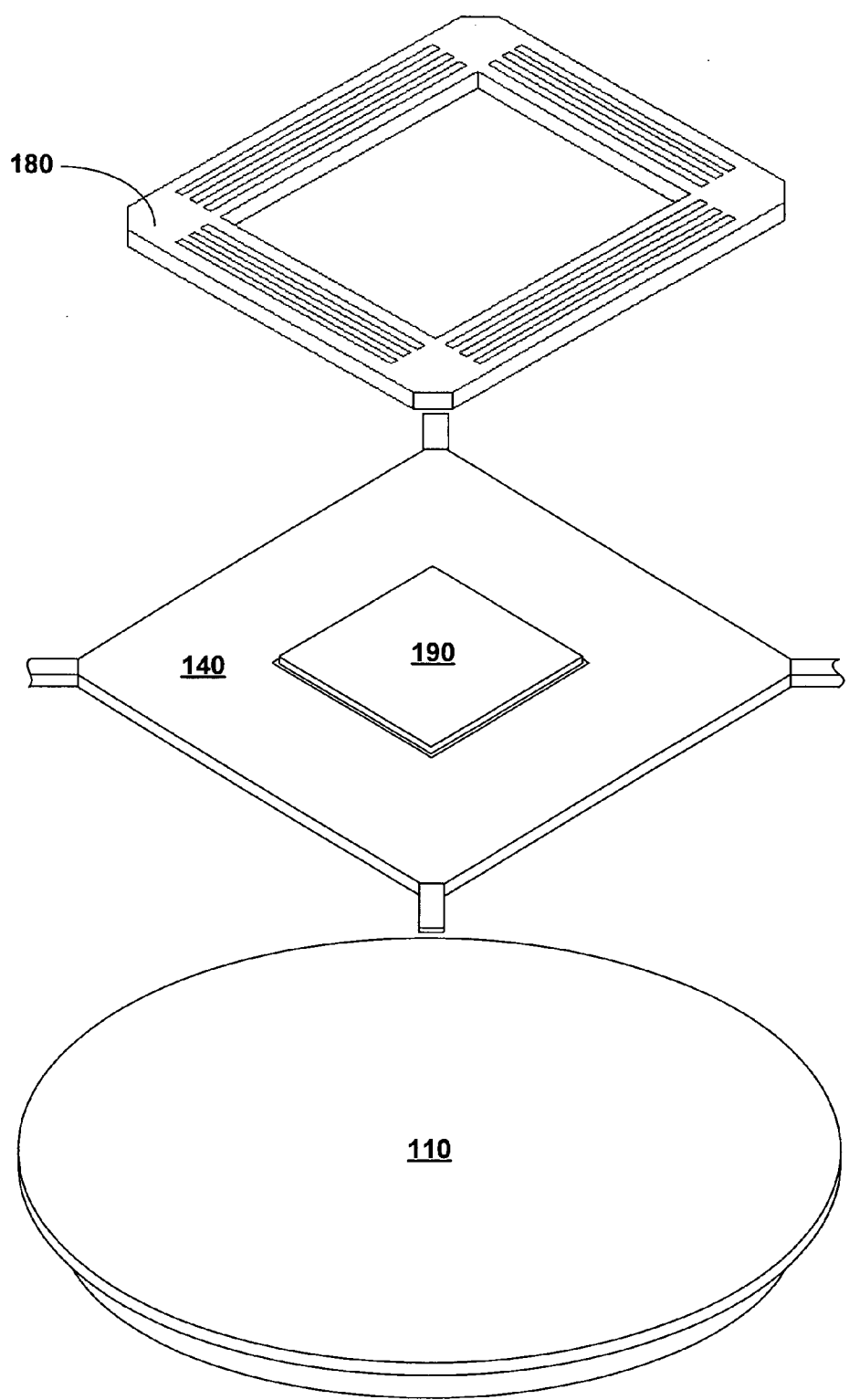
FIG. 7 is an illustration of the processing steps used to assemble the integrated circuit package in accordance with the invention.

FIG. 7 is an illustration of the processing used to assemble the die 190, die attach pad 140, interposer ring substrate 180 and the heat sink mass 110 in accordance with the invention. The interposer ring substrate 180 is first mounted on the die attach pad 140 using an adhesive. The die 190 is next mounted on the die attach pad 140 using an adhesive such that die 190 is centrally located within the hollowed portion of substrate 180.

Appropriate wire bonding connections are then made between the plurality of lead fingers 116 that are selectively connected to die 190 or ring 180 via wire bonds 118. Next the entire assembly is placed faced down on a transfer molding machine mold chase. Then, the drop-in heat sink mass 110 is placed on the entire assembly. There would be a separation gap between the bottom side of die attach pad 140 and the heat sink mass 110. Alternately, in another embodiment, the gap may be filled with the appropriate thermally conductive epoxies or glues to attach the heat sink mass 110 to the die attach pad 140. The entire package is then encapsulated in a plastic molding compound with external leads extended beyond the lead frame.

Figure 8:
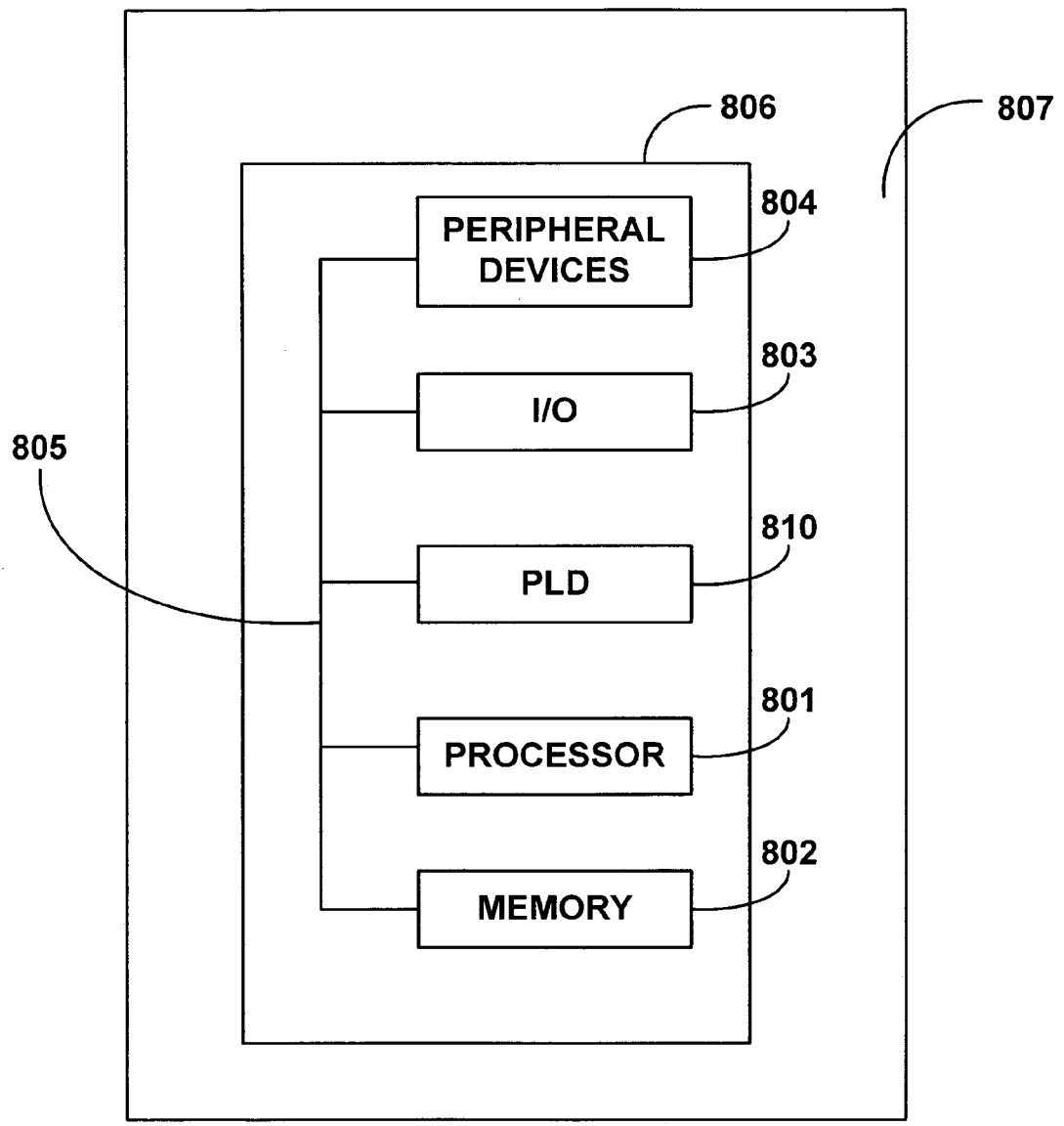
FIG. 8 illustrates a data processing system using an integrated circuit device, such as a programmable logic device, packaged in accordance with certain embodiments of the invention.

FIG. 8 illustrates a data processing system using an integrated circuit device, such as a programmable logic device, packaged in accordance with certain embodiments of the invention. Data processing system 800 may include one or more of the following components: a processor 801, memory 802, I/O circuitry 803, and peripheral devices 804. These components are coupled together by a system bus 805 and are populated on a circuit board 806 which is contained in an end-user system 807.

System 800 can be used in a wide variety of applications, such as computer networking, data networking, instrumentation, video processing, digital signal processing, or any other application where the advantage of using programmable or re-programmable logic is desirable. Programmable logic device 810 can be used to perform a variety of different logic functions.

For example, programmable logic device 810 can be used as a processor or controller that works in cooperation with processor 801. Programmable logic device 810 may also be used as an arbiter for arbitrating access to a shared resource in system 800. In yet another example, programmable logic device 810 can be used as an interface between processor 801 and one of the other components in system 800. It should be noted that system 800 is only exemplary, and that the true scope and spirit of the invention should be indicated by the following claims.

The foregoing description of specific embodiments of the invention has been presented for the purposes of illustration and description. It is not intended to be exhaustive or to limit the invention to the precise form described. Many modifications and variations are possible in light of the teachings above. The embodiment were chosen and described in order to best explain the principles of the invention and its practical applications to enable others skilled in the art to best utilize the invention in various embodiments and with various modifications as are suited to the particular use contemplated.

What is claimed is:

1. An integrated circuit package, comprising:
a die attach pad having a first and second surface, the first and second surface being on opposite sides of the die attach pad;
an integrated circuit die mounted on the first surface, the integrated circuit die having a plurality of terminal pads; and
a substrate, the substrate comprised of a dummy layer, a dielectric layer, and a solder mask structure, which encapsulates the dummy layer and the dielectric layer, the substrate mounted on the first surface, the substrate having an aperture where the aperture encompasses the integrated circuit die, and the substrate having and separating a plurality of conduction bands.

2. The package of claim 1 further including a heat sink where the second surface of the die attach pad is adjacent to the heat sink.

3. The package of claim 2 where the heat sink comprises one or more disk shaped portions.

4. The package of claim 3 where the heat sink comprises two disk shaped portions having a first disk shaped portion adjacent to the die attach pad and a second disk shaped portion adjacent to the first disk shaped portion, the first disk shaped portion having a diameter that is greater than the second disk shaped portion.

5. The package of claim 2 where the heat sink comprises aluminum or copper coated with nickel.

6. The package of claim 2 where the heat sink is attached to the die attach pad using a thermally conductive epoxy.

7. The package of claim 1 where the plurality of conduction bands are located between the inner edge forming the aperture and the outer edge of the substrate.

8. The package of claim 1 where the plurality of conduction bands are ground planes or power planes.

9. The package of claim 1 where the substrate is substantially rectangular with a substantially rectangular aperture.

10. The package of claim 1 wherein the integrated circuit die is mounted on the die attach pad using a thermally conductive, electrically insulating adhesive.

11. The package of claim 1 where the substrate is mounted on the die attach pad using a thermally conductive epoxy or an adhesive tape.

12. The package of claim 1 wherein the plurality of conduction bands are connected to internal lead fingers using wire bonds.

13. The package of claim 12 wherein the wire bonds are formed using copper wires coated with silver or gold.

14. The package of claim 1 wherein the die attach pad further includes tie-bar extensions.

15. The package of claim 1 wherein the integrated circuit die is an ASIC, FPGA, or a CPLD.

16. A data processing system comprising:
processing circuitry;
a memory coupled to the processing circuitry; and
an integrated circuit die package of claim 1.

17. A printed circuit board on which is mounted an integrated circuit package of claim 1.

18. The printed circuit board of claim 17 further comprising a processing circuitry coupled to the integrated circuit package.

19. The printed circuit board of claim 18 further comprising a memory coupled to the processing circuitry and to the integrated circuit package.

20. A method of packaging an integrated circuit comprising:
attaching an integrated circuit die on a die attach pad, the die attach pad having a first and second surface, the first and second surface being on opposite sides of the die attach pad, wherein the integrated circuit die is mounted on the first surface of the die attach pad;
mounting a substrate on the first surface of the die attach pad, the substrate having an aperture where the aperture encompasses the integrated circuit die, the substrate having and separating a plurality of conduction bands, and the substrate comprising a dummy layer, a dielectric layer, and a solder mask structure, which encapsulates the dummy layer and the dielectric layer.

21. The method of claim 20 further including placing a heat sink adjacent the second surface of the die attach pad.

22. The method of claim 21 where the placing comprises attaching the heat sink to the die attach pad using an epoxy or a tape adhesive.

23. An integrated circuit package, comprising:
a die attach pad means having a first and second surface, the first and second surface being on opposite sides of the die attach pad means;
an integrated circuit die means mounted on the first surface, the integrated circuit die means having a plurality of terminal pads; and
a substrate means mounted on the first surface, the substrate means having an aperture where the aperture encompasses the integrated circuit die means, the substrate means having and separating a plurality of conduction means, and the substrate means comprising a dummy layer, a dielectric layer, and a solder mask structure, which encapsulates the dummy layer and the dielectric layer.

* * * * *